United States Patent [19]

Lombardi

[11] 4,110,552
[45] Aug. 29, 1978

[54] ELECTRO/MECHANICAL ENCLOSURE WITH MAGNETIC COVER MEANS

[75] Inventor: Anthony Joseph Lombardi, Flanders, N.J.

[73] Assignee: International Telephone & Telegraph Corporation, Nutley, N.J.

[21] Appl. No.: 779,195

[22] Filed: Mar. 18, 1977

Related U.S. Application Data

[63] Continuation of Ser. No. 593,581, Jul. 7, 1975, abandoned.

[51] Int. Cl.² .............................................. H05K 5/04
[52] U.S. Cl. .............................. 174/35 MS; 220/230; 292/251.5
[58] Field of Search .............. 174/35 GC, 35 MS, 66; 335/303; 248/206 A; 206/818; 220/230; 277/80; 292/251.5

[56] References Cited

U.S. PATENT DOCUMENTS

| 2,974,183 | 3/1961 | Kes et al. ........................ 174/35 GC |
| 3,189,675 | 6/1965 | Moore et al. ..................... 277/80 X |
| 3,234,318 | 2/1966 | Van Lieshout et al. ....... 174/35 MS |
| 3,241,198 | 3/1966 | Baermann ......................... 335/303 |
| 3,277,230 | 10/1966 | Stickney et al. ............... 174/35 GC |
| 3,425,729 | 2/1969 | Bisbing ............................ 292/251.5 |
| 3,451,706 | 6/1969 | Baermann ........................ 292/251.5 |

FOREIGN PATENT DOCUMENTS 743,967 1/1933 France ..................................... 220/230

OTHER PUBLICATIONS

Eccoshield Conductive EMI/RFI Gaskets, Emerson & Cuming Inc., 11-1970.

*Primary Examiner*—C. L. Albritton
*Assistant Examiner*—D. A. Tone
*Attorney, Agent, or Firm*—John T. O'Halloran; Alfred C. Hill

[57] ABSTRACT

An enclosure to ensure EMI and RFI shielding for electronic components and/or protective shielding for mechanical components is disclosed. The enclosure comprises a housing having a bottom, side walls connected to the bottom in a shielding relationship to the components and an opening opposite the bottom. Magnetic means detachably secures a cover to the side walls adjacent the opening to close the opening to complete the shielding of the components. A seal associated with the cover and the magnetic means provides an environmental seal for the opening and enhances the EMI and RFI shielding of the components.

33 Claims, 33 Drawing Figures

ELECTRO/MECHANICAL ENCLOSURE WITH MAGNETIC COVER MEANS

CROSS-REFERENCE TO RELATED APPLICATIONS

This is a continuation of application Ser. No. 593,581 filed July 7, 1975 now abandoned.

BACKGROUND OF THE INVENTION

This invention relates to enclosures for electronic and/or mechanical components to ensure electromagnetic interference (EMI) and radio frequency interference (RFI) shielding for electronic components and/or protective shielding for mechanical components and more particularly to magnetically secure covers for such enclosures.

It is known in the refrigeration art to provide a magnetic latch assembly for the door of a refrigerator. This magnetic latch assembly is located at only one predetermined location on the wall of the refrigerator box adjacent the opening thereof and in a mating location on the door. When the door is closed and attracted by the magnetic latch assembly to close the opening of the refrigerator box a gasket disposed completely around the opening of the refrigerator box is compressed to provide only an atmospheric seal or shielding for the contents of the refrigerator box. There is no intention of or no need to provide EMI and RFI shielding for the contents of the refrigerator box.

The presently employed means for RFI and EMI shielding between electronic enclosures is accomplished by attaching covers over the opening of the enclosure with closely spaced hardware, such as bolts, clamps, latches or other mechanical means. Although these methods are used they are costly and subject to human failings, such as improper tightening of bolts causing distortion or looseness of fit, loss of hardware, particularly in the field where the hardware cannot be replaced, resulting in gaps in the RFI and EMI shielding, etc.

In addition, when such RFI and EMI shielding enclosures are desired to be maintained it is necessary for the maintenance man prior to performing maintenance to unfasten many closely spaced bolts or other hardware to remove the cover to gain access to the electronic components within the enclosure and then refasten the hardware after the maintenance has been performed. In addition, when the cover is removed by unfastening the bolts, all of the subsystems which are contained in compartments within the enclosure for shielding purposes loose the shielding of the cover, thus making it difficult to align the subsystems due to intercompartment interference signals.

SUMMARY OF THE INVENTION

An object of the present invention is to provide an arrangement to ensure EMI and RFI shielding for electronic components and/or protective shielding for mechanical components which minimizes the quantity of fastener hardware.

Another object of the present invention is to provide an arrangement to ensure EMI and RFI shielding for electronic components and/or protective shielding for mechanical components where the cover is easily removed and replaced for maintenance.

Still another object of the present invention is to provide an arrangement to ensure EMI and RFI shields for electronic components and/or protective shielding for mechanical components where the cover is capable of being slid to uncover certain compartmented subsystems for maintenance while keeping other compartmented subsystems covered thereby minimizing intercompartment interference signals.

A feature of the present invention is the provision of an enclosure to ensure EMI and RFI shielding for electronic components and/or protective shielding for mechanical components comprising: a housing for the components having at least a bottom, side walls connected to the bottom in a shielding relationship to the components and at least a top opening opposite the bottom; at least a top cover for the top opening; and first magnetic means to detachably secure at least the top cover to the side walls adjacent the top opening to close the top opening to complete the shielding of the components.

Another feature of the present invention is the provision of a sealing means associated with one of the above-mentioned top cover and first magnetic means to provide an environmental seal for the top opening and to enhance the EMI and RFI shielding components.

Still another feature of the present invention is the provision of the above-mentioned first magnetic means which is continuous and conforms to the configuration of the side walls of the housing.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENTS

Figures 1, 2, 3, 4:
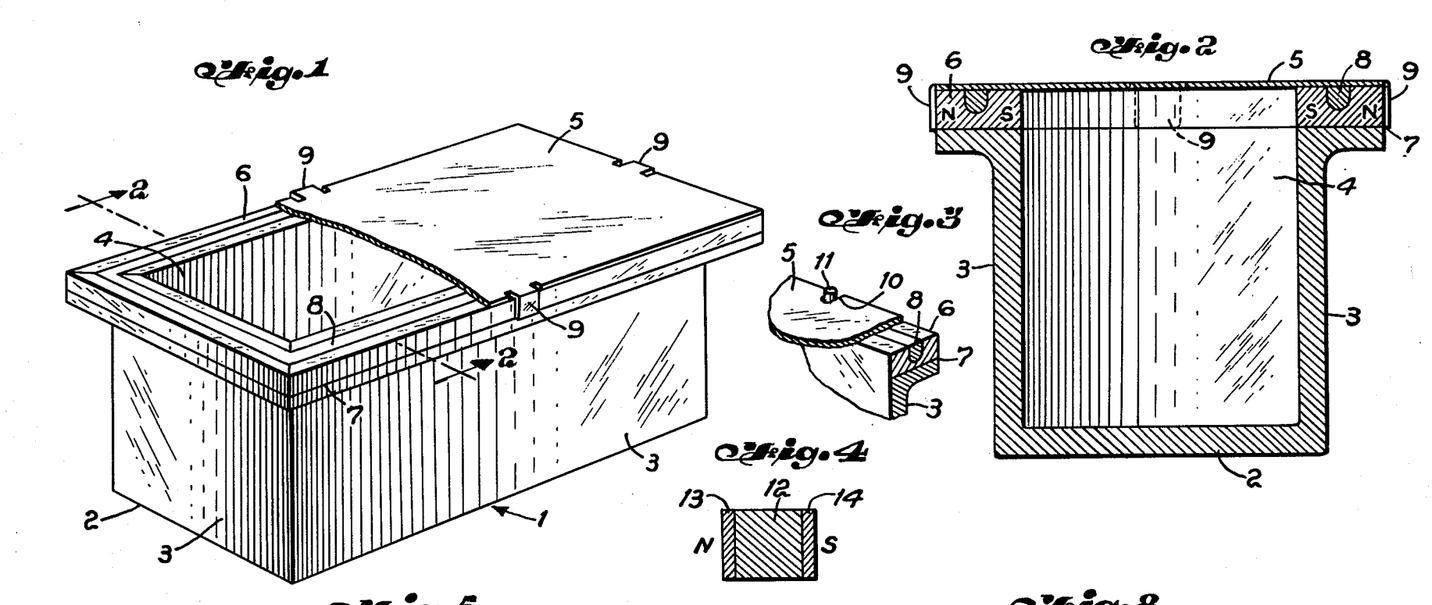
FIG. 1 is an isometric view of an enclosure with the cover partially removed in accordance with the principles of the present invention.
FIG. 2 is a cross-sectional view of FIG. 1 taken along lines 2—2 of FIG. 1.
FIG. 3 is a fragmentary view of an alternative arrangement to prevent the cover of the housing of the present invention from sliding off the top of the housing during shock and vibration conditions.
FIG. 4 is a cross-sectional view of a second embodiment of the magnet assembly in accordance with the principles of the present invention.

FIGS. 1 and 2 illustrate therein an electro/mechanical enclosure that is designed to provide effective EMI and RFI shielding of electronic components and protective shielding such as against water, moisture and dust, for mechanical devices. The basic components of the enclosure include the housing 1 having a bottom 2, side walls 3 connected to bottom 2 in a shielding relation with components (not shown) contained in housing 1 and an opening 4 opposite bottom 2. The top cover 5 is detachably secured to side walls 3 adjacent top opening 4 to close opening 4 by means of a magnet 6 which is continuous and conforms to the configuration of side walls 3 or opening 4. Magnet 6 has the magnetic poles oriented as illustrated in FIG. 2 and is secured to the top of side walls 3 by a conductive adhesive 7. Magnet 6 is also plated with a good conductive material and to effect the required electrical contact for EMI and RFI shielding a non-magnetic conductive mesh rope-like material 8 is compressed by the magnetic attraction of cover 5 to magnet 6. The conductive mesh rope-like material 8 can have substituted therefore a rope-like material of smooth surface containing conductive elastomers, such as a conductive rubber rope, when environmental protection or shielding is required in addition to electrical shielding.

Although cover 5 as shown indicates that the entire cover is fabricated of a magnetic material, this does not exclude the fact that cover 5 can by of any non-magnetic material, such as a non-magnetic metal, plastic or rubber, depending on the end application of the enclosure provided the area of cover 5 that interfaces magnet 6 has secured thereto an interfacing magnetic material, such as iron, mild steel, non-corrosive steel or the like. In order to ensure good electrical contact between cover 5 and material 8 and also prevent corrosion, cover 5 should be plated, such as with gold, silver, copper, etc. Tabs 9 are formed on four sides of cover 5 and engage side walls 3 to prevent cover 5 from sliding off opening 4 in cases of repeated shock and vibration conditions.

FIG. 3 illustrates an alternative means of preventing cover 5 from sliding which includes two notches 10, one on each end of cover 5, each of which engages one of pins 11 that are fixed to the top edge of side wall 3.

Housing 1 may be fabricated of either a magnetic material or a non-magnetic material, such as plastic, depending on whether housing 1 is used for electrical or mechanical shielding.

FIG. 4 illustrates a second magnet assembly that can be substituted for the magnet assembly illustrated in FIGS. 1 and 2. This second embodiment of the magnet assembly includes magnet 12 sandwiched between two magnetic pole pieces 13 and 14. This magnet assembly is employed in the embodiment of FIGS. 5, 6, 8–11, 22, 25 and 33, however, it is to be understood that the magnet assembly of FIG. 2 of the magnet assemblies hereinbelow described may be substituted therefore.

Figure 5:
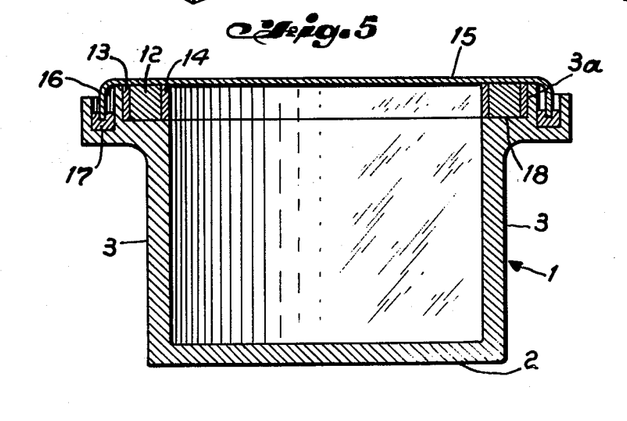
FIG. 5 is a cross-sectional view of a second embodiment of the enclosure in accordance with the principles of the present invention.

FIG. 5 illustrates another effective arrangement for providing EMI and RFI shielding for electronic enclosures and moisture sealing for mechanical enclosures. In this arrangement the magnet assembly of FIG. 4, which is also continuous and conforms to the configuration of the side walls, is employed. It has been shown that this type of magnet assembly has a much higher holding capacity than the open circuit magnet of FIG. 2 which has no pole pieces.

Cover 15 is fabricated with a lip 16 that extends downward along the four sides of cover 15. Lip 16 is made long enough so that when the magnet assembly of FIG. 4 interfaces with cover 1, lip 16 compresses the non-magnetic conductive mesh rope-like material 17 thereby ensuring good EMI and RFI shielding. If a conductive rubber rope-like material is substituted for material 17, a good atmospheric shielding as well as EMI and RFI shielding is provided. Housing 1 with its side walls 3 and bottom 2 and cover 15 can be fabricated from the same material as described with reference to FIGS. 1 and 2. The magnet assembly is secured to housing 1 in a recess 3a in the inner surface of side walls 3 by a conductive adhesive 18.

Figures 6, 12:
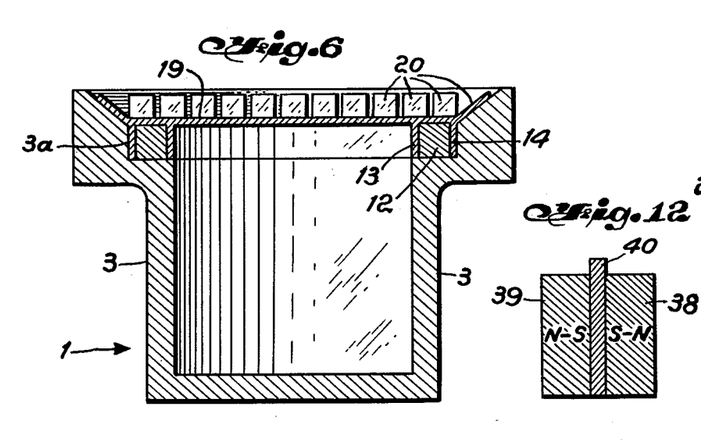
FIG. 6 is a cross-sectional view of a third embodiment of the enclosure in accordance with the principles of the present invention.
FIG. 12 is a cross-sectional view of a third embodiment of the magnet assembly in accordance with the principles of the present invention.
Figure 7:
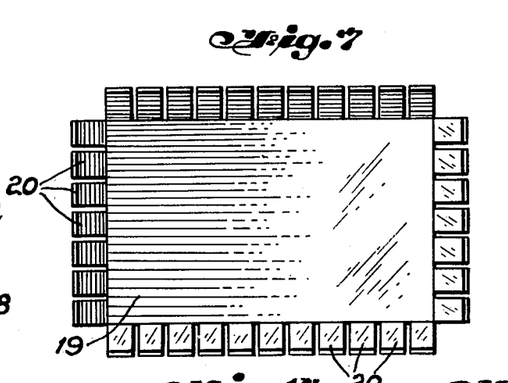
FIG. 7 is a partial top view of the cover for the housing of FIG. 6.

FIGS. 6 and 7 illustrate a cover 19 that can be a solid magnetic sheet or a contact cover 19 having the fingers 20 secured thereto. Fingers 20 extend beyond magnetic sheet 19 which interfaces with the magnet assembly of FIG. 4 including magnet 12 and pole pieces 13 and 14. When the cover assembly is placed over the magnet assembly, magnetic extraction causes magnetic sheet 19 to interface with the magnet assembly and when this occurs, fingers 20 will conform to the slope at the opening of housing 1, thereby ensuring the desired contact for EMI and RFI shielding. Fingers 20 will perform and function best if they are flexible and fabricated from non-magnetic spring material, such as beryllium copper phosphor bronze or some silver copper alloy.

As in the embodiment of FIG. 5, the magnetic assembly of FIG. 4 is secured by a conductive adhesive to recess 3a in the inner surface of side walls 3 of housing 1.

Figure 8:
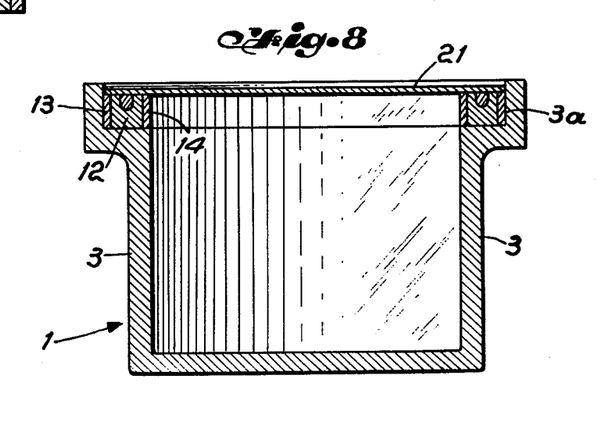
FIG. 8 is a cross-sectional view of a fourth embodiment of the enclosure in accordance with the principles of the present invention.

FIG. 8 illustrates an embodiment of the enclosure of this invention which incorporates the magnet assembly of FIG. 4 secured such as by a conductive adhesive in a recess 3a in the inner surface of side walls 3 of housing 1. The cover 21 is a razor blade thin spring magnetic material, such as spring steel, which will conform to surface irregularities. To ensure good electrical contact, cover 21 should be plated. Since cover 21 fits down into recess 3a, vibration and shock will not cause cover 21 to move. Another feature of this embodiment is that it affords a tamperproof enclosure which can be opened only by destroying the cover 21 or by providing slots at the corners of recess 3a so that the spring magnetic material of cover 21 may be peeled from the magnet assembly of FIG. 4.

Figure 9:
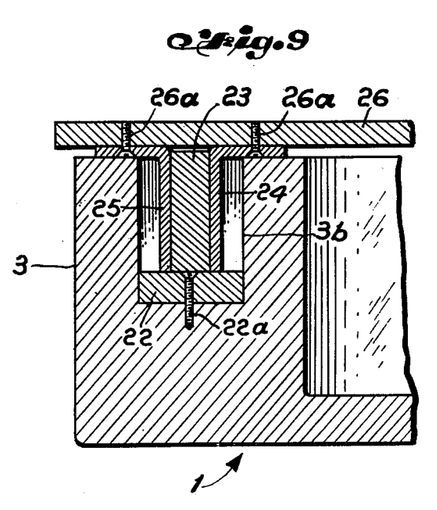
FIG. 9 is a partial cross-sectional view of a fifth embodiment of the enclosure in accordance with the principles of the present invention.

FIG. 9 illustrates housing 1 having a recess 3b in the top surface of side walls 3 in which is secured a steel strike 22 by a conductive adhesive or by a bolt along line 22a and a magnet assembly including magnet 23 and L-shaped magnetic pole pieces 24 and 25, which are secured to cover 26 by bolts at lines 26a or by a conductive adhesive. In this embodiment, the magnet assembly is secured to the cover 26 rather than to housing 1 and due to steel strike 22, housing 1 can be fabricated from a non-magnetic material including plastic and yet there is ensured the desired EMI and RFI shielding for the components contained in the housing.

Figure 10:
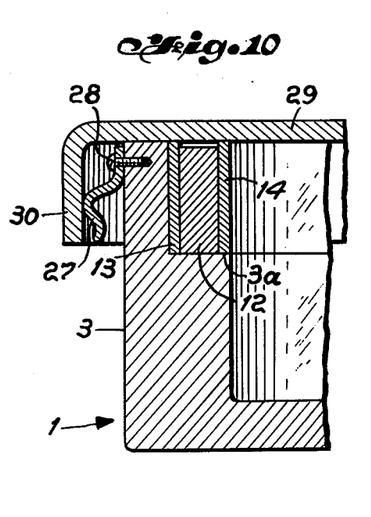
FIG. 10 is a partial cross-sectional view of a sixth embodiment of the enclosure in accordance with the principles of the present invention.

FIG. 10 illustrates another enclosure embodiment employing the magnet assembly of FIG. 4 including magnet 12 and pole pieces 13 and 14. This magnet assembly is secured such as by a conductive adhesive to a recess 3a in side walls 3 of housing 1. Spring contact fingers 27 are secured to the outer surface of side walls 3 such as by a bolt along line 28 or by a conductive adhesive in such a manner that when cover 29 is attracted to the magnet assembly, spring fingers 27 are compressed by lip 30 of cover 29 toward side walls 3. Spring 27 and cover 29 with its lip 30 are conductive so that the contact made by spring contact fingers 27 against lip 30 enhances the EMI and RFI shielding for the enclosure.

Figures 11, 17, 18, 20:
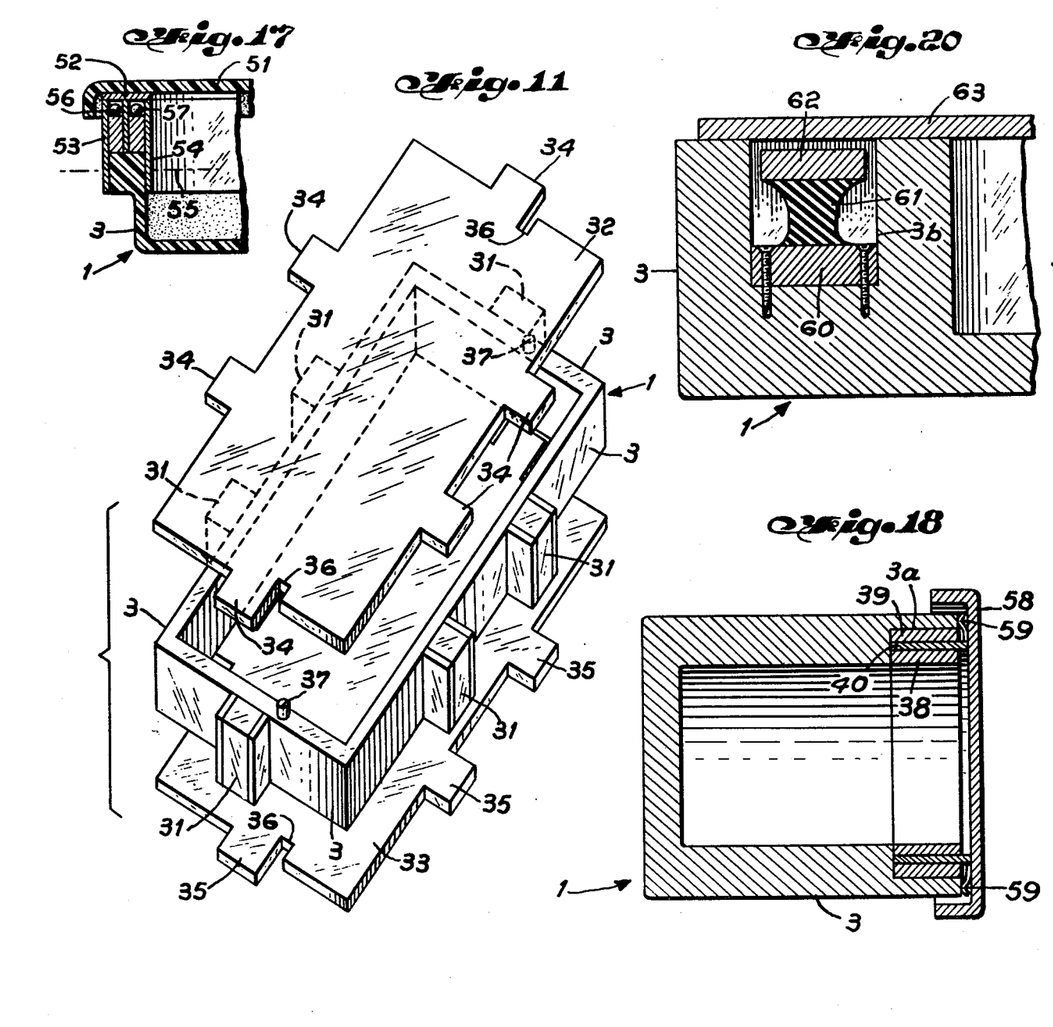
FIG. 11 is an isometric exploded view of a seventh embodiment of the enclosure in accordance with the principles of the present invention.
FIG. 17 is a partial cross-sectional view of a twelfth embodiment of the enclosure in accordance with the principles of the present invention.
FIG. 18 is a cross-sectional view of a thirteenth embodiment of the enclosure in accordance with the principles of the present invention.
FIG. 20 is a partial cross-sectional view of a fourteenth embodiment of the enclosure in accordance with the principles of the present invention.

FIG. 11 discloses an enclosure including housing 1 with its side walls 3 having attached thereto magnet assemblies 31 in such a manner that the top cover 32 and the bottom cover 33 are attracted by opposite ends of magnet assemblies 31. The magnet assemblies 31 are similar to that illustrated in FIG. 4 to provide added holding capacity. By proper orientation of tabs 34 on top cover 32 and tabs 35 on bottom cover 33 it is ensured that covers 32 and 33 are assembled to housing 1 only in the desired orientation and further that the entire enclosure may be nested in a overall assembly with a definite orientation. Magnet assemblies 31 are bonded to housing 1 by a conductive adhesive. Housing 1 may be fabricated of any non-magnetic material including plastic, rubber, etc. To prevent covers 32 and 33 from sliding off housing 1 during vibration and shock conditions, notches 36 are provided in both covers to engage pins 37, which are secured in the top surface of side walls 3 as illustrated.

FIG. 12 illustrates another magnet assembly including two magnets 38 and 39 sandwiching therebetween a pole piece 40. The two magnets 38 and 39 having their poles oriented as illustrated and are bonded or mechanically fastened to pole piece 40 which is fabricated from a magnetic material. Plating of pole pieces is essential to ensure good electrical contact and prevent corrosion. This magnet assembly, as well as the previously described magnet assembly, can be supplied in long lengths and then cut to fit a housing having almost any configuration.

The magnet assembly of FIG. 12 is employed in the embodiments of FIGS. 13-19 and also can be substituted for the previously described enclosure embodiments employing the magnet assembly of FIGS. 2 and 4 as well as for those further magnet assemblies described below. It should also be recognized that the enclosure embodiments about to be described employing the magnet assembly of FIG. 12 may have substituted, therefor, the magnetic assembly of FIG. 2 or the magnetic assembly of FIG. 4.

Figure 13:
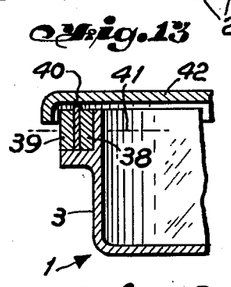
FIG. 13 is a partial cross-sectional view of an eighth embodiment of the enclosure in accordance with the principles of the present invention.

FIG. 13 illustrates an enclosure embodiment employing the magnetic assembly of FIG. 12 which is bonded, screwed or riveted to the outer surface of side walls 3 of housing 1 where the assembly is screwed or riveted to the recess in side walls 3 along line 41. To ensure good EMI and RFI contact between cover 42 and pole piece 40, both parts should be plated with a low electrical resistance metal, such as gold, silver, copper, etc. Cover 42 as stated with respect to previous embodiments, need not be fabricated entirely of a magnetic material as long as the immediate area of cover 42 which interfaces with the magnetic pole piece 40 is magnetic. Housing 1 can be of any non-magnetic material, the choice of which is predicated on end use, i.e., mechanical or electrical shielding.

Figures 14, 16:
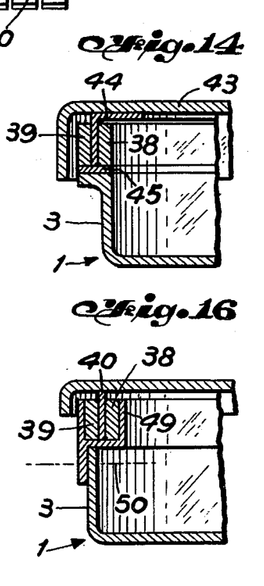
FIG. 14 is a partial cross-sectional view of a ninth embodiment of the enclosure in accordance with the principles of the present invention.
FIG. 16 is a partial cross-sectional view of an eleventh embodiment of the enclosure in accordance with the principles of the present invention.

FIG. 14 illustrates another enclosure embodiment having a non-magnetic cover 43 onto which is fastened an L-shaped pole piece 44 sandwiched between magnets 38 and 39. The magnet assembly is attracted to a mild steel strike 45. Strike 45 is fastened to housing 1 by means of bolts or conductive adhesives. In this instance the magnetic attraction is between the magnet assembly and strike 45 since the magnet assembly is secured to cover 43 rather than to housing 1. Plating is also essential in this arrangement to provide proper EMI and RFI shielding.

Figure 15:
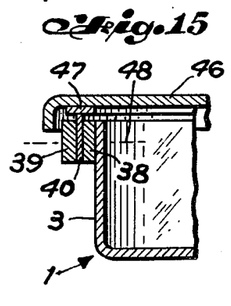
FIG. 15 is a partial cross-sectional view of a tenth embodiment of the enclosure in accordance with the principles of the present invention.

FIG. 15 illustrates an enclosure including cover 46 with a magnetic strike or interface member 47 fastened to cover 46. The magnet assembly as shown in FIG. 12 is bolted to the outer surface of side walls 3 of housing 1 by bolts along line 48 or by conductive adhesive. Housing 1 is simply a deep drawn can onto which is fastened the magnet assembly of FIG. 12. The magnet details and the plating requirements are fully set forth in the description of FIGS. 12 and 13.

FIG. 16 illustrates an enclosure embodiment which is similar to FIG. 15, the main difference being that the magnet assembly of FIG. 12 is part of a non-magnetic adapter channel 49 fastened to the outer surface of side walls 3 of housing 1 by means of screws along line 50 or by a conductive adhesive. The entire assembly, channel 49 and the magnet assembly of FIG. 12, can be fabricated in almost any length and size, cut up and fastened to side walls of housing 1 which in this case is a deep drawn can of non-magnetic material.

FIG. 17 includes a cover 51 of non-magnetic material, such as a plastic, which has a magnetic material interface piece 52 attached to cover 51. The magnet assembly of FIG. 12 is sandwiched between strips 53 and 54 to form a channel that extends beyond the magnet assembly and springs over and fastens to the top of side walls 3 of housing 1. Strips 53 and 54 are secured to the top of side walls 3 along line 55 by bolts or by being bonded to this portion of side walls 3 by a conductive adhesive. Since the other end of strips 53 and 54 also extended beyond the magnets, there is provided two channels into which a conductive rubber rope-like member or a non-magnetic metallic mesh roping members 56 and 57 can be compressed thereby providing the required mechanical and/or EMI and RFI shielding.

Figure 19:
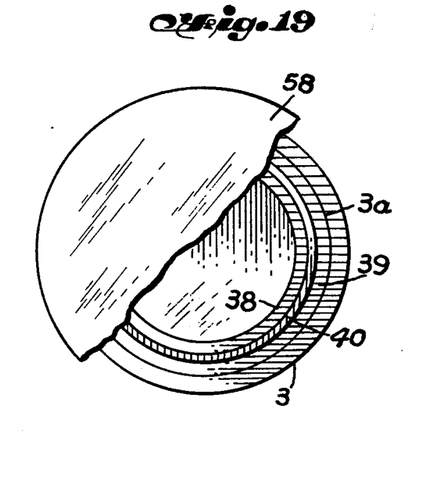
FIG. 19 is a top view of FIG. 18 with the cover partially removed.

FIGS. 18 and 19 illustrate how the same effective shielding or sealing is obtainable with a circular housing or cavity configuration using the same magnetic concept for securing cover 58 to housing 1 as described in the previous embodiments of this application. The side walls 3 of housing 1 have a recess 3a on the inner surface thereof to receive the magnet assembly of FIG. 12 where the magnets 38 and 39 and the pole piece 40 are circular in configuration with contact finger 59 being provided between cover 58 and the upper end of side walls 3. By doming cover 58 and providing the proper conductive rubber seal, the enclosure can also be used as a pressure tight container for externally applied pressures.

FIG. 20 illustrates another type of magnet assembly including the magnetic strike 60 disposed in a recess 3b of side walls 3 of housing 1. To strike 60 is connected an elastic conductive elastomer 61 to which is connected a magnet 62. When cover 63 is placed on the outer end of side walls 3, magnet 62 is attracted to cover 63 and the conductive elastomer stretches with the movement of magnet 62 to make contact with cover 63. In this arrangement as in other previously described embodiments, housing 1 may be of a non-magnetic material including plastic, while cover 63 is magnetic, at least at the interface with magnet 62, as mentioned with regard to previously described embodiments.

Figure 21:
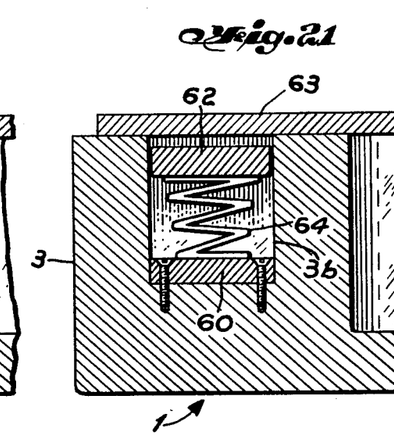
FIG. 21 is a partial cross-sectional view of a fifteenth embodiment of the enclosure in accordance with the principles of the present invention.

FIG. 21 illustrates an embodiment similar to FIG. 20, but substitutes a bellows wall spring 64 having a length equal to the length of the magnet for the conductive elastomer.

Figure 22:
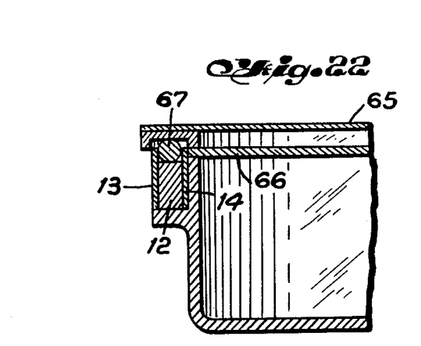
FIG. 22 is a partial cross-sectional view of a sixteenth embodiment of the enclosure in accordance with the principles of the present invention.

FIG. 22 illustrates an embodiment in which cover 65 can be a very light gauge aluminum or plastic cover, depending on whether the end use is electrical or mechanical shielding. Fastened to cover 65 is a recessed magnetic frame 66 which provides the magnetic attraction to the magnet assembly of FIG. 4 including pole pieces 13 and 14 and magnet 12. The recessed magnetic frame 66 also prevents cover 65 from sliding off during shock or vibration. Pole pieces 13 and 14 protrude slightly above magnet 12 so that a non-magnetic metallic mesh or conductive rubber rope-like member 67 is compressed between magnetic frame 66 and magnet 12 when the frame 66 is attracted to pole pieces 13 and 14 and thereby seals the container. Compression of rope-like member 67 in this fashion produces the desired electrical or mechanical shielding.

Figure 23:
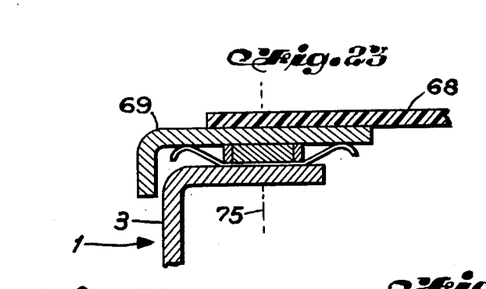
FIG. 23 is a partial cross-sectional view of a seventeenth embodiment of the enclosure in accordance with the principles of the present invention.
Figure 24:
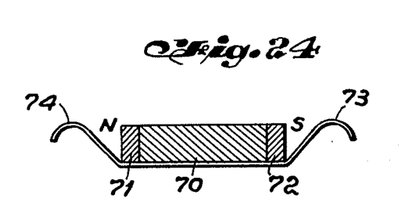
FIG. 24 is a cross-sectional view of a fourth embodiment of the magnet assembly in accordance with the principles of the present invention.

FIG. 23 illustrates a means of EMI and RFI shielding by means of composite covers 68 and 69. Cover 68 is non-magnetic including plastic and cover 69 is magnetic. The magnet assembly, as shown in FIG. 24 including magnet 70, pole pieces 71 and 72 and spring contact fingers 73 and 74, is disposed between cover 69 and the top end of side walls 3 of housing 1. The magnet assembly of FIG. 24 can be supplied in strips, cut to length and fastened to the upper end of side walls 3 of housing 1 by bolts along line 75. The spring contact fingers 73 and 74 of the magnet assembly of FIG. 24 are non-magnetic and they extend above magnet 70. When cover 69 interfaces with the magnet assembly, spring contact fingers 73 and 74 are depressed ensuring good EMI and RFI shielding.

Figure 25:
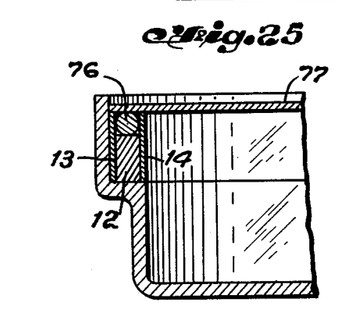
FIG. 25 is a partial cross-sectional view of an eighteenth embodiment of the enclosure in accordance with the principles of the present invention.

FIG. 25 is similar to FIG. 8 except that the non-magnetic metal mesh or conductive rubber rope-like material 76 is retained between magnet 12 and pole pieces 13 and 14 and is compressed when cover 77 is attracted to pole pieces 13 and 14. As in FIG. 8, this enclosure is tamper-proof and cover 77 is removed as described with reference to FIG. 8.

Figure 26:
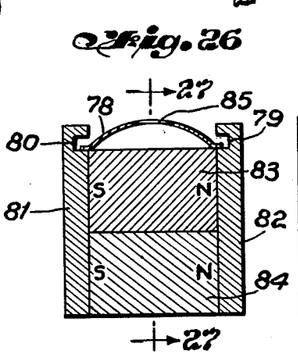
FIG. 26 is a cross-sectional view of a fifth embodiment of the magnet assembly in accordance with the principles of the present invention.
Figure 27:
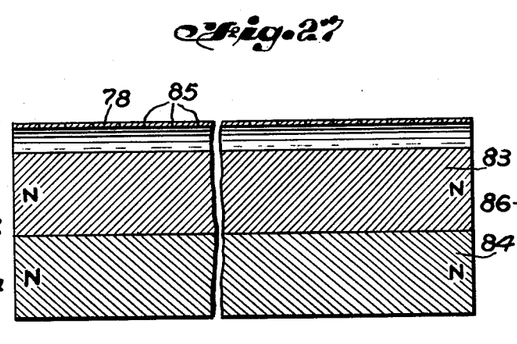
FIG. 27 is a cross-sectional view of FIG. 26 taken along line 27—27 of FIG. 26.
Figure 28:
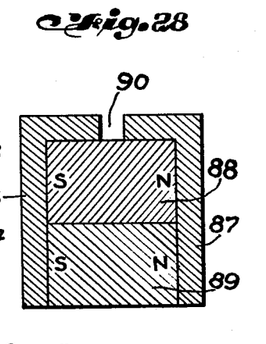
FIG. 28 is a cross-sectional view of a sixth embodiment of the magnet assembly in accordance with the principles of the present invention.

FIGS. 26, 27 and 28 illustrate other magnet assemblies which can be supplied in long lengths that may be cut to size to fit almost all housing configurations. These assemblies can also be fabricated circular to fit round housings. In FIGS. 26 and 27, spring contact 78 is captured in grooves 79 and 80 of pole pieces 81 and 82 sandwiching therebetween two magnets 83 and 84. The magnets 83 and 84, the pole pieces 81 and 82 and the spring contact 78 are made as an integral assembly. Spring contact 78 contains a series of saw slots 85 along its length to provide the necessary flexibility to ensure good contact over irregular surfaces. Spring contact 78 is non-magnetic. Spring contact 78 can be fabricated from beryllium copper, phosphor bronze or silver/beryllium copper laminate.

FIG. 28 illustrates two pole pieces 86 and 87 bonded to magnets 88 and 89 in the configuration shown. As shown, pole pieces 86 and 87 are configured to provide a small gap 90 therebetween. This magnet assembly provides an arrangement which has an extremely high holding capacity.

Figure 29:
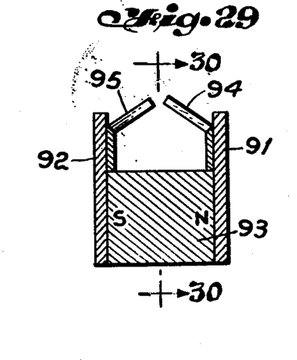
FIG. 29 is a cross-sectional view of a seventh embodiment of the magnet assembly in accordance with the principles of the present invention.
Figure 30:
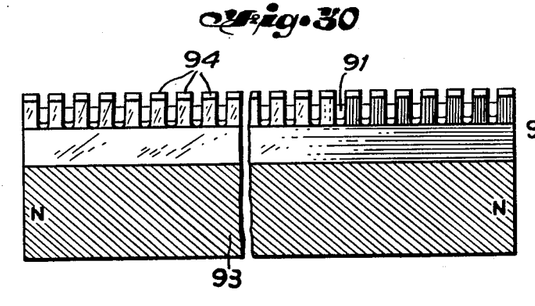
FIG. 30 is a cross-sectional view of FIG. 29 taken along line 30—30 of FIG. 29.

FIGS. 29 and 30 illustrate still another magnet assembly including pole pieces 91 and 92 having sandwiched therebetween magnet 93. This magnet assembly, rather than including spring contact 78, includes contact fingers 94 and 95 secured to the inner surface of pole pieces 91 and 92, respectively.

As in the previous magnet assembly, this magnet assembly can be supplied in long lengths that may be cut to size to fit almost all housing configurations and can be fabricated to be circular to fit round housings.

Figure 31:
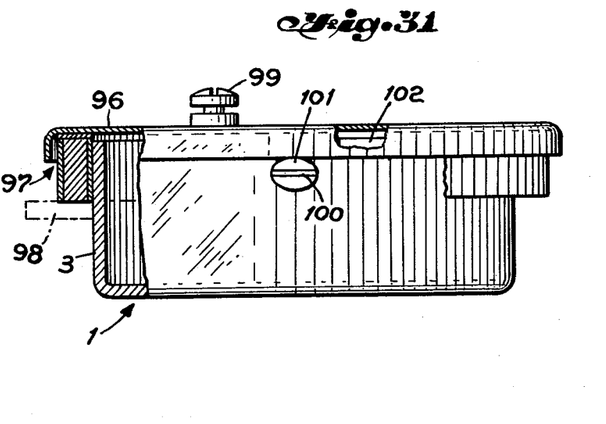
FIG. 31 is a side view partially in cross-section illustrating several different techniques for removing the cover from the housing in accordance with the principles of the present invention.

FIG. 31 illustrates four different techniques for removing cover 96 from magnet assembly 97 secured to side walls 3 of housing 1. The first technique includes placing a piece of mild steel 98 to the underside of the pole piece of magnet assembly 97 to short out the magnet. The second technique includes rotating a screw 99 that threads into cover 96 and bears against side walls 3 of housing 1 and thereby pries the cover off. The third technique includes the use of elliptical or eccentric screw heads 100 that are part of housing 1 or cover 96 and when rotated to bear against an interfacing surface 101, cause the desired separation. The fourth technique is to provide a hole or fitting 102 in cover 96 or housing 1 which permits the use of air pressure to provide the necessary force to separate cover 96 from housing 1.

In addition to these techniques for separating cover 96 from housing 1, two other techniques are capable of being employed for separation of the cover and housing when the cover has no lip thereon. These two techniques include first the sliding of the cover off the magnetic means attached to housing 1, and second when the cover is a thin flexible cover, such as a spring steel cover, the cover may be peeled from the magnetic means making it easier to remove the cover and less chance of having the cover permanently bent out of shape.

Figure 32:
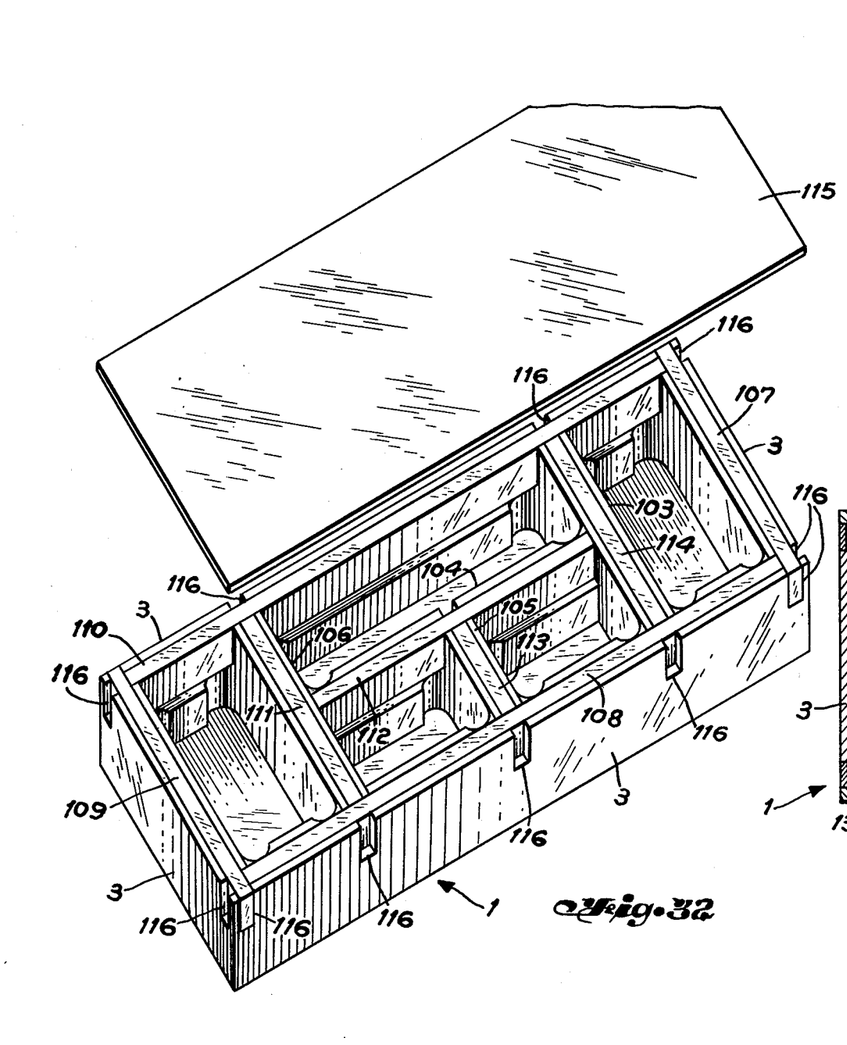
FIG. 32 is an isometric exploded view of a nineteenth embodiment of the enclosure in accordance with the principles of the present invention.

FIG. 32 illustrates a good example of how the magnetic hold-down concept for EMI and RFI shielding can be incorporated in enclosures having complex configurations. As shown, housing 1 includes compartment walls 103-106 to provide compartments for EMI and RFI shielding for the components of various subsystems of an overall system. Side walls 3 of housing 1 as well as the compartment walls 103-106 have secured thereto magnet assemblies 107-114 so that when cover 115 is placed in position, the magnet assemblies 107-114 secure cover 115 not only to the outer end of side walls 3, but also to the outer end of compartment walls 103-106 to provide shielding for the subsystems as well as the overall system contained in housing 1. Magnet assemblies 107-114 can assume any of the configurations disclosed herein. The arrangement shown in FIG. 32 is especially useful in packaging of microwave integrated circuits.

To facilitate assembly and disassembly of the cover, such as cover 115, the magnet assembly may be added to the housing and cover assembly after these two parts are set in place sliding the magnet assemblies through slots 116.

In all the embodiments disclosed herein, the magnets may be assembled with their pole pieces with this assembly then being snapped into the slot or recess provided in the enclosure such that when the cover is placed in position the enclosure is completed for the desired shielding.

If it is desired to align and/or test the subsystems in the compartment provided by compartment wall 103 and the side walls 3, it is possible to slide over 115 to uncover this compartment and yet maintain the other compartments shielded to prevent EMI and RFI interaction between the compartments still shielded by cover 115 and the uncovered compartment. This technique of sliding cover 115 to uncover a particular compartment in housing 1 and maintaining the other compartments shielded to prevent EMI and RFI is possible with the other compartments contained in housing 1.

Figure 33:
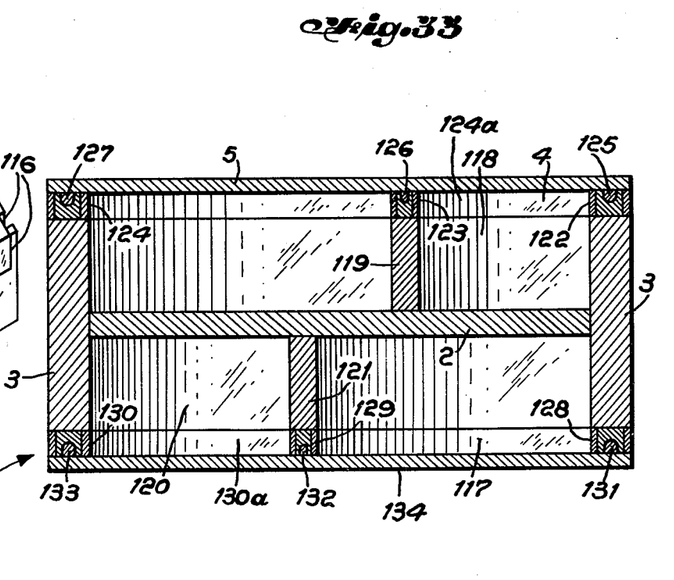
FIG. 33 is a cross-sectional view of a twentieth embodiment of the enclosure in accordance with the principles of the present invention.

FIG. 33 illustrates an embodiment incorporating the magnetic means for detachably securing a top cover and a bottom cover to an enclosure by use of any one of the magnet assemblies disclosed herein. This embodiment differs from the embodiment of FIG. 1 in that bottom 2 is disposed intermediate the top and bottom ends of side walls 3 of housing 1 to provide a top opening 4 and a bottom opening 117. Housing 1 includes on the top of bottom 2 various compartment walls 118 and 119 and below bottom 2 housing 1 is also divided into compartments by compartment walls 120 and 121. The magnet assemblies 122-124 and 124a have the configuration as illustrated in FIG. 4 with the non-magnetic metallic mesh or conductive rubber rope-like material 125-126 being provided as illustrated. These magnet assemblies detachably secure top cover 5 to complete the shielding of the top compartments of housing 1.

Magnet assemblies 128-130 and 130a which take the form of the magnet assemblies of FIG. 4 and having included therein the nonmagnetic metallic mesh or conductive rubber rope-like material 131-133, detachably secure a bottom cover 134 to housing 1 and shield the compartments below bottom 2.

The different magnetic assemblies disclosed herein may be interchangeably employed with the various enclosure embodiments disclosed and they may be secured to the housing or to the cover for the housing so as to satisfy any required enclosure specification.

The various embodiments of enclosures with magnetic cover means disclosed provide the following advantages:

1. The need for hold-down hardware (bolts, latches, clamps, etc.) is not required.
2. Drafting effort is simplified in design and layout of enclosures.
3. Fabrication is simplified (less drilling and tapping of holes).
4. Weight reduction is possible since no room is required for hold-down hardware.
5. The covers are easily assembled or removed and replaced for maintenance purposes, where easy removal is intended. This advantage is achieved since there are no bolts or similar hardware to unfasten and then refasten to remove and replace the cover.
6. Good environmental and electrical isolation around any shaped enclosure is ensured.
7. No locking devices are required to prevent loosening of hardware during shock and vibration conditions.
8. The arrangement is insensitive to temperature changes.
9. No special tools for assembly or disassembly of covers are needed.
10. It is possible to shield compartment subsystems while testing and/or aligning a particular compartmentized subsystem in the enclosure.

While I have described above the principles of my invention in connection with specific apparatus it is to be clearly understood that this description is made only by way of example and not as a limitation to the scope of my invention as set forth in the objects thereof and in the accompanying claims.

I claim:
1. An enclosure to ensure electromagnetic interference (EMI) and radio frequency interference (RFI) shielding for electronic components and/or protective shielding for mechanical components comprising:
   a housing for said components having at least a bottom, side walls connected to said bottom in a shielding relationship to said components and at least a top opening opposite said bottom;
   at least a top cover for said top opening;

first rigid continuous magnetic means completely surrounding said top opening and conforming to the configuration of said side walls to detachably secure at least said top cover to said side walls adjacent said top opening to close said top opening to complete said shielding of said components, said magnetic means having a north pole and a south pole disposed in the same plane as said top opening with one of said north and south poles being disposed adjacent the opening of said top opening and the other of said north and south poles being disposed remote from the opening of said top opening, said first magnetic means having disposed therein at least a first continuous recess coextensive therewith; and a continuous non-magnetic, metallic mesh rope-like member disposed in and coextensive with said first recess, said rope-like member being compressed by the magnetic attraction of said top cover and said first magnetic means to provide an environmental seal for said top opening and to enhance said EMI and RFI shielding of said components.

2. An enclosure according to claim 1, wherein
said first magnetic means includes
a magnet secured to said side walls completely surrounding said top opening;
said first recess being disposed in said magnet.

3. An enclosure according to claim 2, wherein
said top cover is non-magnetic and includes an interface of magnetic material connected thereto in a superimposed relationship with respect to said magnet.

4. An enclosure according to claim 1, wherein
said first magnetic means includes
a magnet secured to said side walls completely surrounding said top opening, and
a pair of pole pieces disposed at opposite poles of said magnet and coextensive therewith;
said first recess being disposed between said pole pieces.

5. An enclosure according to claim 4, wherein
said top cover is non-magnetic and includes an interface of magnetic material connected thereto in a superimposed relationship with respect to said magnet and said pair of pole pieces.

6. An enclosure according to claim 1, wherein
said first magnetic means includes
a pole piece,
a pair of magnets sandwiching said pole piece therebetween,
said pole piece and said pair of magnets being coextensive with each other, secured to said side walls and surrounding said top opening;
said first recess being a first cavity formed by said pole piece and one of said magnets; and
a second recess being a second cavity formed by said pole piece and the other of said magnets.

7. An enclosure according to claim 6, wherein
said top cover is non-magnetic and includes an interface of magnetic material connected thereto in a superimposed relationship with respect to said magnets and said pole piece.

8. An enclosure according to claim 1, wherein
said first magnetic means includes
a magnet secured in a second recess in the inner surface of said side walls adjacent to and completely surrounding said top opening;
said first recess being disposed in said magnet.

9. An enclosure according to claim 8, wherein
an outer wall of said second recess extends beyond said magnet, and
said top cover is prevented from sliding off said top opening by said outer wall during shock and vibration conditions.

10. An enclosure according to claim 9, wherein
said top cover is non-magnetic and includes an interface of magnetic material connected thereto in a superimposed relationship with respect to said magnet.

11. An enclosure according to claim 8, wherein
said top cover is non-magnetic and includes an interface of magnetic material connected thereto in a superimposed relationship with respect to said magnet.

12. An enclosure according to claim 1, wherein
said first magnetic means includes
a magnet, and
a pair of pole pieces sandwiching said magnet therebetween,
said pair of pole pieces and said magnet being coextensive with each other and secured in a second recess in the inner surface of said side walls adjacent to and completely surrounding said top opening;
said first recess being disposed in said magnet.

13. An enclosure according to claim 12, wherein
an outer wall of said second recess extends beyond said magnet, and
said top cover is prevented from sliding off said top opening by said outer wall during shock and vibration conditions.

14. An enclosure according to claim 13, wherein
said top cover is non-magnetic and includes an interface of magnetic material connected thereto in a superimposed relationship with respect to said magnet and said pair of pole pieces.

15. An enclosure according to claim 12, wherein
said top cover is non-magnetic and includes an interface of magnetic material connected thereto in a superimposed relationship with respect to said magnet and said pair of pole pieces.

16. An enclosure according to claim 1, wherein
said first magnetic means includes
a pole piece,
a pair of magnets sandwiching said pole piece therebetween,
said pole piece and said pair of magnets being coextensive with each other and secured in a second recess in the inner surface of said side walls adjacent to and completely surrounding said top opening;
said first recess being a first cavity formed by said pole piece and one of said magnets; and
a third recess being a second cavity formed by said pole piece and the other of said magnets.

17. An enclosure according to claim 16, wherein
an outer wall of said second recess extends beyond said magnet, and
said top cover is prevented from sliding off said top opening by said outer wall during shock and vibration conditions.

18. An enclosure according to claim 17, wherein
said top cover is non-magnetic and includes an interface of magnetic material connected thereto in a superimposed relationship with respect to said magnets and said pole piece.

19. An enclosure according to claim 16, wherein said top cover is non-magnetic and includes an interface of magnetic material connected thereto in a superimposed relationship with respect to said magnets and said pole piece.

20. An enclosure according to claim 1, further including
securing means associated with said top cover and said side walls to prevent said top cover from sliding off said top opening during shock and vibration conditions.

21. An enclosure according to claim 1, wherein said top cover is stiff.

22. An enclosure according to claim 1, wherein said top cover is flexible.

23. An enclosure according to claim 22, wherein said flexible top cover is spring steel.

24. An enclosure according to claim 1, wherein said first magnetic means includes
a magnet secured to said top cover completely surrounding said top opening;
said first recess being disposed in said magnet.

25. An enclosure according to claim 24, wherein said housing is non-magnetic and includes an interface of magnetic material connected thereto adjacent to and completely surrounding said top opening in a superimposed relationship with respect to said magnet.

26. An enclosure according to claim 1, wherein said first magnetic means includes
a magnet, and
a pair of pole pieces sandwiching said magnet therebetween,
said pair of pole pieces and said magnet being coextensive with each other and secured to said top cover adjacent to and completely surrounding said top opening;
said first recess being disposed in said magnet.

27. An enclosure according to claim 26, wherein said housing is non-magnetic and includes an interface of magnetic material connected thereto adjacent to and completely surrounding said top opening in a superimposed relationship with respect to said magnet and said pair of pole pieces.

28. An enclosure according to claim 1, wherein said first magnetic means includes
a pole piece, and
a pair of magnets sandwiching said pole piece therebetween,
said pole piece and said pair of magnets being coextensive with each other and secured to said top cover adjacent to and completely surrounding said top cover;
said first recess being a first cavity formed by said pole piece and one of said magnets; and
a second recess being a second cavity formed by said pole piece and the other of said magnets.

29. An enclosure according to claim 28, wherein said housing is non-magnetic and includes an interface of magnetic material connected thereto adjacent to and completely surrounding said top opening in a superimposed relationship with respect to said pair of magnets and said pole piece.

30. An enclosure according to claim 1, wherein said housing further includes
compartment walls extending from certain of said side walls and between said bottom and said top cover to provide compartments for said EMI and RFI shielding of said components of various subsystems of an overall system; and
wherein
said first magnetic means further detachably secures said top cover to the top edge of said compartment walls.

31. An enclosure according to claim 1, wherein said bottom is disposed intermediate top and bottom ends of said side walls to provide said top opening and a bottom opening; and further including
a bottom cover for said bottom opening; and
a second magnetic means to detachably secure said bottom cover to said side walls adjacent said bottom opening to close said bottom opening to complete said EMI and RFI shielding for those of said components contained between said bottom and said bottom opening.

32. An enclosure according to claim 31, further including
a sealing means associated with one of said bottom cover and said second magnetic means to provide an environmental seal for said bottom opening and to enhance said EMI and RFI shield for those of said components contained between said bottom and said bottom opening.

33. An enclosure according to claim 32, wherein said sealing means includes
a conductive rubber rope-like member.

* * * * *